US008347251B2

(12) United States Patent
Paternoster et al.

(10) Patent No.: US 8,347,251 B2
(45) Date of Patent: Jan. 1, 2013

(54) INTEGRATED CIRCUIT AND MANUFACTURING PROCESS FACILITATING SELECTIVE CONFIGURATION FOR ELECTROMAGNETIC COMPATIBILITY (75) Inventors: Paul Paternoster, Los Altos, CA (US); Vaibhavi Sabharanjak, Fremont, CA (US); Po-Shen Lai, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 1372 days.

(21) Appl. No.: 11/967,880

(22) Filed: Dec. 31, 2007

(65) Prior Publication Data

US 2009/0166679 A1 Jul. 2, 2009

(51) Int. Cl.
*G06F 17/50* (2006.01)

(52) U.S. Cl. ........ 716/115; 716/106; 716/111; 716/112; 716/136

(58) Field of Classification Search .......... 716/106–115, 716/136
See application file for complete search history.

(56) References Cited

U.S. PATENT DOCUMENTS

| | | |
|---|---|---|
| 5,267,210 A | 11/1993 | McClure et al. |
| 5,504,439 A | 4/1996 | Tavana |
| 5,585,676 A | 12/1996 | Uda et al. |
| 5,594,367 A | 1/1997 | Trimberger et al. |
| 5,900,742 A | 5/1999 | Kolze et al. |
| 5,958,026 A | 9/1999 | Goetting et al. |
| 6,018,793 A | 1/2000 | Rao |
| 6,034,539 A | 3/2000 | Hwang |
| 6,049,225 A | 4/2000 | Huang et al. |
| 6,057,705 A | 5/2000 | Wojewoda et al. |
| 6,086,627 A | 7/2000 | Bass, Jr. et al. |
| 6,124,732 A | 9/2000 | Zilic et al. |
| 6,285,211 B1 | 9/2001 | Sample et al. |
| 6,324,655 B1 | 11/2001 | Matoba et al. |
| 6,327,125 B1 | 12/2001 | Colclaser et al. |
| 6,369,613 B1 | 4/2002 | Costello et al. |
| 6,393,547 B1 | 5/2002 | Mason |
| 6,411,123 B1 | 6/2002 | Chang |
| 6,446,250 B1 | 9/2002 | Becker |
| 6,496,033 B2 | 12/2002 | Rees |
| 6,512,401 B2 | 1/2003 | Clark et al. |
| 6,519,190 B2 | 2/2003 | Derner |
| 6,536,030 B1 | 3/2003 | Tanaka |
| 6,550,047 B1 | 4/2003 | Becker |
| 6,664,483 B2 | 12/2003 | Chong et al. |
| 6,668,361 B2 | 12/2003 | Bailis et al. |
| 6,678,848 B1 | 1/2004 | Chan |
| 6,815,807 B2 | 11/2004 | Corisis |
| 6,823,502 B2 | 11/2004 | Wingren et al. |

(Continued)

*Primary Examiner* — Paul Dinh (74) *Attorney, Agent, or Firm* — Patterson, Thuente Christensen Pedersen PA (57) ABSTRACT

An integrated circuit (IC) having a selectively-designated electromagnetic compatibility (EMC) performance characteristic. The IC includes an IC die having an input or output (I/O) node. A first I/O cell of a first type associated with the I/O node provides a first EMC performance characteristic, and a second I/O cell of a second type associated with the I/O node provides a second EMC performance characteristic different from the first EMC performance characteristic. A first bonding pad is electrically coupled with the first I/O cell, and a second bonding pad is electrically coupled with the second I/O cell. The IC die can be packaged into a packaged IC having an I/O pin corresponding to the I/O node. The I/O pin is wired to one of either the first bonding pad or the second bonding pad, but not to the other, such that a pinout for the I/O node is preferentially provided having one of either the first EMC performance characteristic or the second EMC performance characteristic.

10 Claims, 7 Drawing Sheets

U.S. PATENT DOCUMENTS

| | | |
|---|---|---|
| 6,903,581 B2 | 6/2005 | Clark et al. |
| 6,981,090 B1 | 12/2005 | Kutz et al. |
| 7,034,570 B2 | 4/2006 | McClintock et al. |
| 7,099,175 B2 | 8/2006 | Lee et al. |
| 7,202,701 B1 | 4/2007 | Chambers |
| 7,250,660 B1 | 7/2007 | Huang et al. |
| 7,251,805 B2 | 7/2007 | Koo |
| 7,266,463 B2 | 9/2007 | Dixon et al. |
| 7,285,980 B2 | 10/2007 | Bansal et al. |
| 2001/0018967 A1 | 9/2001 | Uead et al. |
| 2003/0107398 A1 | 6/2003 | Bailis et al. |
| 2003/0107399 A1 | 6/2003 | Bailis et al. |
| 2004/0128626 A1 | 7/2004 | Wingren et al. |
| 2005/0052215 A1 | 3/2005 | Ohshima et al. |
| 2006/0071320 A1 | 4/2006 | Shibata et al. |
| 2006/0168373 A1 | 7/2006 | Broome et al. |
| 2006/0253623 A1* | 11/2006 | Katayama et al. ............. 710/52 |
| 2007/0115747 A1 | 5/2007 | Taniguchi et al. |
| 2007/0139076 A1 | 6/2007 | Chambers |
| 2007/0170451 A1 | 7/2007 | Bansal |
| 2007/0263458 A1 | 11/2007 | Ong |
| 2008/0062596 A1* | 3/2008 | Miller et al. ................... 361/56 |
| 2008/0169486 A1* | 7/2008 | Toyoshima et al. .......... 257/203 |

* cited by examiner

INTEGRATED CIRCUIT AND MANUFACTURING PROCESS FACILITATING SELECTIVE CONFIGURATION FOR ELECTROMAGNETIC COMPATIBILITY

FIELD OF THE INVENTION

The invention relates generally to integrated circuits (ICs) and IC construction and, more particularly, to ICs that facilitate selectively configuring electromagnetic compatibility performance of input or output circuits of integrated circuits utilizing the IC package.

BACKGROUND OF THE INVENTION

Designers of integrated circuits such as application specific integrated circuits (ASICs) are often confronted with having to make design trade-offs in their product to support the wide range of requirements of their customers. One type of design trade-off is providing input or output (I/O) cells in the ASIC that meet both, functional performance requirements, and electromagnetic compatibility performance requirements.

Functional requirements include performance characteristics such as input sensitivity, output drive capacity, output slew rate, and the like, which are needed to ensure that the IC interfaces with, and operates reliably, in its end product. Electromagnetic compatibility (EMC) requirements include such characteristics as suppression of spurious emissions of electromagnetic interference (EMI), and immunity from external sources of EMI and electrical transients such as electrical fast transient burst interference (EFT/B) and electrostatic discharge (ESD).

Many design tradeoffs exist when designing an I/O cell preferentially emphasizing EMC performance or emphasizing functional performance. In most situations, a one-size-fits-all I/O cell is simply not feasible. For instance, EMI suppression, whether for suppressing EMI and fast transients into, or out of, the IC, typically involves low-pass filtering I/O signals. Such low-pass filtering can adversely affect many important functional characteristics, such as the slew rate and potentially the drive capacity for output drivers. Likewise, for input circuits, the filtering can affect their sensitivity, impedance matching to the source, and input signal bandwidth.

Protection against transient spikes such as ESD typically involves implementing design techniques that can also adversely affect the functional performance in generally the same ways as the filtering techniques. A variety of ESD protection techniques for ICs are known, including placing impedances in series with the input or output lines to slow down and attenuate the ESD, or placing breakdown devices such as Zener diodes on the input or output lines to redirect a portion of the ESD to the power or ground nodes. Furthermore, because ESD events can have amplitudes in the thousands of Volts, chip-level ESD protection may also include layout and certain device design features, such as device sizing, separation, and isolation between devices such as the use of separate wells and trenches in the substrate, as described, for example in U.S. Pat. No. 7,250,660. All of these protection techniques can limit the functional performance of I/O cells.

Another important drawback associated with I/O cells having increased EMC-related performance is the difficulty or inability to support analog bypass lines or test points, which provide an ability to selectively bypass portions of the I/O circuitry. Bypass lines may be useful in a variety of instances, including in manufacturing testing and in system troubleshooting. Typically, bypass lines are enabled or disabled using a programmable electronic switch. Even with the switch opened, bypass lines can nevertheless present a path, via parasitic effects such as capacitive coupling, for EMI or transients to be carried past filters or other suppression circuitry. Moreover, for ESD immunity, the electronic switch must be designed to withstand ESD events, presenting a number of challenges to IC designers. The desired level of EMC performance can be thus difficult to achieve for I/O cells having bypass lines.

U.S. Pat. No. 6,327,125, discloses an IC with ESD-protective circuitry for use in testing, packaging, shipping, and installation into a system. The protective circuitry is disconnected via a programming step of blowing fuses. This approach removes the ESD protection prior to operation of the IC; thus, the system in which the IC is installed must provide sufficient ESD protection external to the IC to protect the IC. The approach of the '125 patent therefore does not address the needs of customers who require ESD or other EMC-related protection to be built into the IC, and has the disadvantage of requiring a special programming step.

U.S. Pat. No. 7,251,805 discloses manufacturing a "mega-ASIC" with excessive hardware functionality, only a portion of which is actually enabled in any operational ASIC. The different functional blocks can be disabled or enabled by a programming step prior to, or after packaging using FLASH memory, and the bonding pads of the device are connected to the appropriate functional blocks using programmable switches such as fuses or anti-fuses. A drawback of the mega-ASIC approach is the extra programming step required to configure the device, which represents an additional cost of manufacture.

Published U.S. Patent Application No. 2007/0170451, discusses a solution for bypassing a voltage regulator device in an IC by providing different bonding pads for hard wiring each IC power pin to either an input node or an output node of a corresponding voltage regulator device. This arrangement provides an IC that is configurable during the wire bonding process to operate at a higher voltage (enabling and connecting the voltage regulators), or at lower voltage (bypassing the voltage regulators altogether) without a programming step. However, while the '451 publication offers a technique for selectively wiring an IC pin to one node or to another node as a bypass, it does not address any of the challenges associated with the EMC-related trade-offs applicable to input or output cells discussed above.

While these approaches have addressed certain aspects of the challenges in designing ICs, these approaches are either too selective or tend to require additional programming or design solutions. A more effective and efficient solution is needed for managing the EMC performance design tradeoffs when designing ICs.

SUMMARY OF THE INVENTION

One aspect of the invention is directed to an integrated circuit (IC) having a selectively-designated electromagnetic compatibility (EMC) performance characteristic. The IC includes an IC die having an input or output (I/O) node. A first I/O cell of a first type associated with the I/O node provides a first EMC performance characteristic, and a second I/O cell of a second type associated with the I/O node provides a second EMC performance characteristic that is different from the first EMC performance characteristic. A first bonding pad is electrically coupled with the first I/O cell, and a second bonding pad is electrically coupled with the second I/O cell. The IC further includes an IC package having an I/O pin corresponding to the I/O node. The I/O pin is wired to one of either the first bonding pad or the second bonding pad, but not to the other, such that a pinout for the I/O node is preferentially provided having one of either the first EMC performance characteristic or the second EMC performance characteristic.

A method according to another aspect of the invention is directed to manufacturing an IC to selectively designate EMC performance of the IC. According to the method, an EMC performance level required for the IC is determined from among a first EMC performance level and a second EMC performance level that is different from the first EMC performance level. A die of the IC that has a plurality of different types of input or output (I/O) cells for a common I/O signal path is packaged into an IC package having a plurality of pins. The packaging includes preferentially wiring a pin of the plurality of pins that is associated with the common I/O signal path to either a first type or a second type of I/O cell for the common I/O signal path such that: to designate the first EMC performance level, the first type of I/O cell of the plurality of different types of I/O cells is wired to the pin; and to designate the second EMC performance level, the second type of I/O cell of the plurality of different types of I/O cells is wired to the pin.

Another aspect of the invention is directed to an IC produced by a process for manufacturing an IC to selectively designate EMC performance of the IC, with the process including packaging, into an IC package having a plurality of pins, a die of the IC that has a plurality of different types of input or output (I/O) cells for a common I/O node. The packaging includes preferentially wiring a pin of the plurality of pins that is associated with the I/O node to either a first type or a second type of I/O cell for the common I/O node, such that: to designate a first type of EMC performance, the first type of I/O cell of the plurality of different types of I/O cells is wired to the pin; and to designate a second type of EMC performance, the second type of I/O cell of the plurality of different types of I/O cells is wired to the pin.

A further aspect of the invention is directed to a kit for fabricating an integrated circuit (IC) having a selectively-designated electromagnetic compatibility (EMC) performance characteristic. The kit includes an IC die mask and a wire bonding process definition. The IC die mask has features that facilitate production of an IC that includes the following: an input or output (I/O) node, a first I/O cell of a first type associated with the I/O node, the I/O cell of the first type providing a first EMC performance characteristic, a second I/O cell of a second type associated with the I/O node, the second I/O cell providing a second EMC performance characteristic that is different from the first EMC performance characteristic, a first bonding pad electrically coupled with the first I/O cell, and a second bonding pad distinct from the first bonding pad, the second bonding pad electrically coupled with the second I/O cell. The wire bonding process definition defines wire connections to be made between the IC die and an IC package having an I/O pin corresponding to the I/O node such that, in a packaged IC resulting from performance of the wire bonding process, the I/O pin is wired to one of either the first bonding pad or the second bonding pad, but not to the other. A resulting pinout for the I/O node is preferentially provided having one of either the first EMC performance characteristic or the second EMC performance characteristic.

Aspects of the invention provide a number of advantages including, for example, using the wire bonding process to preferentially select from among multiple different I/O cells associated with a common I/O signal. The wire bonding process is performed regardless of whether or not an IC is configurable; therefore, the configurability that the wire bonding process supports does not come at any significant additional cost.

Unlike IC designs known in the art, the invention recognizes that preferentially selecting different I/O cells using wire bonding is particularly well-suited for EMC purposes. For example, an ESD-protected I/O cell can have a location on the die that is well-isolated from more susceptible structures and devices of the IC die. The high voltages and currents of the ESD event can thus be diverted from the IC circuitry while being conducted away, as much as possible, via bonding wires, which generally have a higher current carrying capacity than the conductive lines and other structures present on the die itself. The bonding wires are also spaced further apart from other conductors on the IC die, reducing capacitive and inductive coupling of the transients or EMI to other circuits present on the die.

Reduced cost is another benefit offered by aspects of the invention for IC manufacturers, especially for manufacturers of ASICs. The typical process for production of an IC design involves producing a lithographic mask. The lithographic mask defines characteristics of circuits (transistor types, sizes, routing, vias . . . etc.) to be formed on a silicon substrate to produce an IC die. The creation of the lithographic mask involves one of the greatest cost involved in a typical ASIC production process. This cost typically depends on the size of transistors to be formed on the silicon substrate. For 0.45 nanometer technology, the cost of lithographic masks can be in the range of several million dollars. Once the cost of lithographic mask production has been incurred, the remaining steps such as IC die fabrication, testing, and packaging are extremely low in comparison. Therefore, certain aspects of the present invention provide for the advantage of allowing customizability of I/O cells through the wire bonding process, as opposed to implementing customized options on the IC die itself.

Another benefit offered by aspects of the invention for IC manufacturers, especially for manufacturers of ASICs, may be improved time-to-market for new designs, and reduced production lead times for products on-order. The ability to select between different types of I/O cells for a common same signal line facilitated by embodiments of the invention permits IC manufacturers to easily configure ICs of a similar function that meet substantially different performance requirements without having to manage production of different IC dies. Embodiments of the present invention provide a solution in which specialized I/O cells are pre-made on the IC die and, for each input or output signal, a certain type of I/O cell can be selected after the dies are manufactured to meet the functional performance or EMC performance required by the customer for that IC. By shifting the implementation of the selection to take place in the IC packaging process and not in the IC die design and manufacturing processes, time-to-market or order lead time for that customer may be substantially improved.

A number of other advantages will become apparent from the following Detailed Description of the Preferred Embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE PREFERRED EMBODIMENTS

Aspects of the invention are directed to integrated circuit (IC) devices and their manufacture. Persons skilled in the relevant arts should appreciate that aspects of the invention will apply to a wide variety of IC technologies without limitation to the examples described herein. Examples of IC technologies include ICs utilizing digital electronics, analog electronics, and mixed signal technologies, as well hybrid devices that include passive components. The IC technologies can be based on any suitable semiconductor technology, such as, for example, silicon, gallium arsenide, etc., or any combination thereof, and on any suitable device technology such as, for example, CMOS, TTL, ECL, and the like, or any combination thereof. IC products can also include any type of functionality such as, without limitation, memory (e.g., RAM, ROM, PROM, EEPROM, etc.), logic family, programmable logic (e.g., PAL, PLA, FPGA, etc.), microprocessor/microcontroller, amplifier or signal conditioning circuitry, filters, interface circuitry, analog-to-digital, digital-to-analog, power supply circuitry, radio frequency and microwave devices, application specific integrated circuit (ASIC), microelectromechanical systems (MEMS), and the like.

Figure 1:
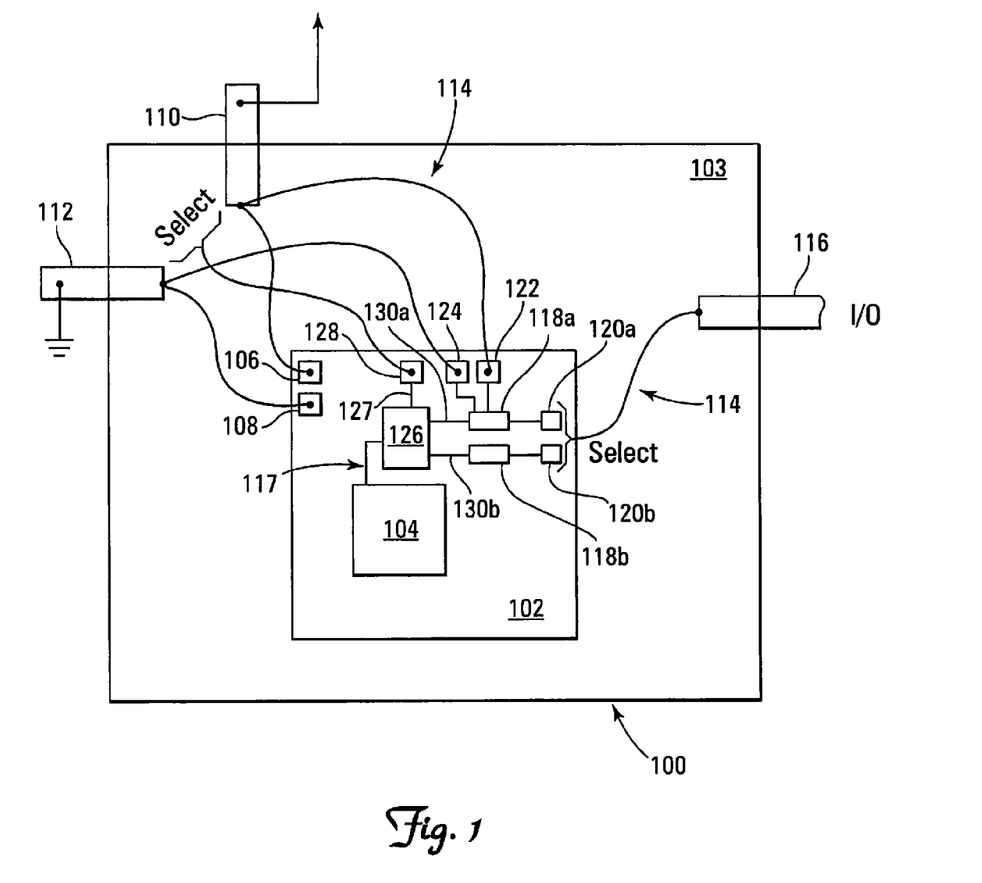
FIG. 1 is a block diagram illustrating a portion of an exemplary packaged integrated circuit (IC) in accordance with aspects of the invention.

FIG. 1 is a diagram illustrating a portion of exemplary IC 100. IC 100 includes a die 102 having semiconductor devices formed thereupon and an IC package 103 encapsulating die 102. Die 102 includes core logic 104 and bonding pads 106 and 108 that facilitate connection to pins 110 and 112, respectively, of package 103. Bonding pads 106 and 108 are connected to core logic 104 using conductive structures of the die (not shown), such as, for example, a metal layer.

Following fabrication of die 102, die 102 is placed in package 103, and connections are made from the package pins to the bonding pads, typically with wires 114. The connections of wires 114 to the package pin-out and to the bonding pads may be welded, or otherwise suitably electrically and mechanically secured. Wire bonding processes are well-known, and any suitable process may be used in accordance with aspects of the invention.

IC package 103 includes input or output (I/O) pins, such as I/O pin 116 that carries signals into, or out of, core logic 104 from or to a source or destination external to IC 100. I/O signals from core logic 104, such signals carried by I/O signal path 117, are interfaced with the external I/O circuit connected via I/O pin 116 by I/O cells, such as I/O cell 118a or I/O cell 118b. Bonding pads 120a and 120b are respectively coupled to I/O cells 118a and 118b.

I/O signal path 117, in one embodiment, is a single conductor that carries either an input signal, or an output signal at any time, in common mode (i.e., using the signal ground as the signal return path). In a related embodiment, I/O signal path 117 carries a single input or output by a pair of conductors in differential mode. In another type of embodiment, I/O signal path 117 represents both, an input signal path, and an output signal path, each of which may be either in common mode or differential mode.

I/O cells 118a and 118b differ from one another in terms of their electromagnetic compatibility (EMC) performance. In the embodiment depicted in FIG. 1, I/O cell 118a has an increased level of EMC performance relative to I/O cell 118b. There may be a any of a variety of differences in the circuitry or physical layout of the devices or components making up I/O cells 118a and 118b including, but not limited to, I/O cell 118a having additional EMI filtering, transient suppression, or having an entirely different circuit topology or physical arrangement, than I/O cell 118b.

Figure 2:
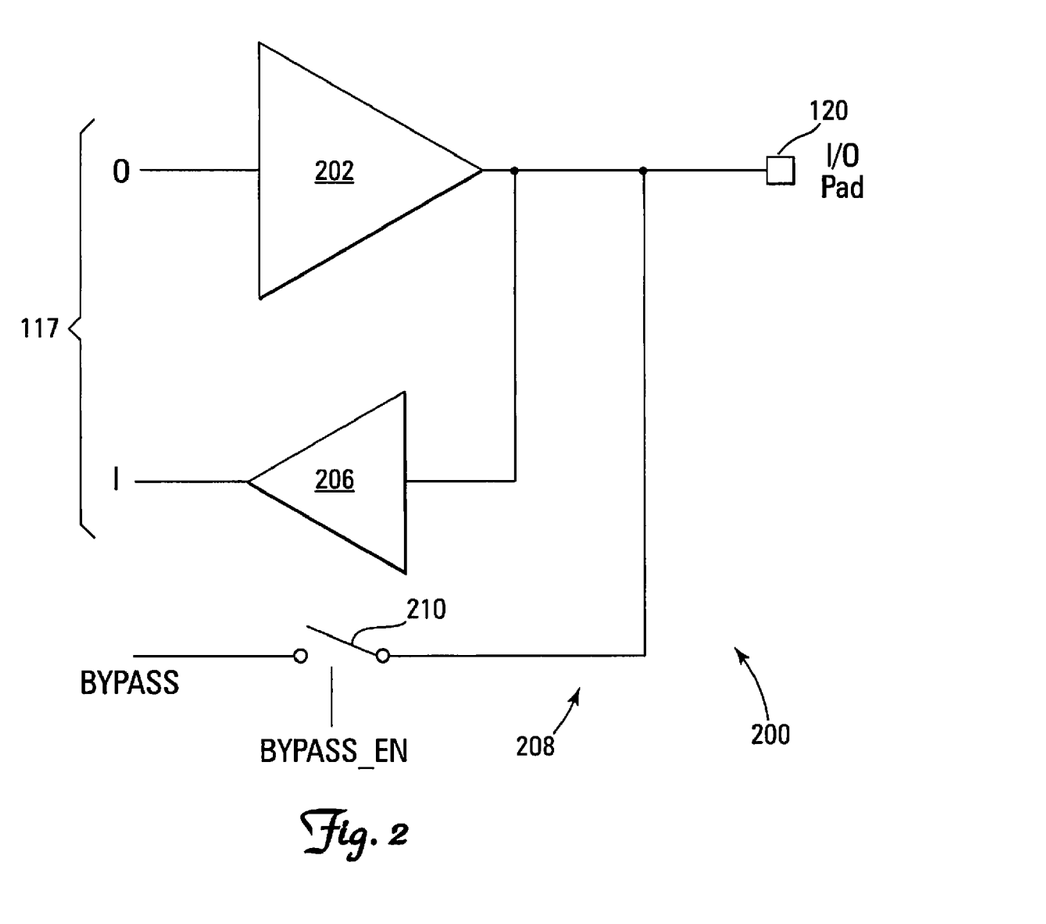
FIG. 2 is a diagram illustrating an input or output (I/O) cell that may be present in the exemplary IC of FIG. 1 that has a relatively lower level of electromagnetic compatibility (EMC) performance according to aspects of the present invention.

Referring now to FIG. 2, an exemplary I/O cell 200 is depicted, which is one embodiment of I/O cell 118b. I/O cell 200 includes an output circuit portion 202 that accepts output signal O from the core logic via I/O signal path 117 as its input and drives the external circuit (not shown) connected to I/O pad 120b. Output circuit portion 202, in various embodiments, includes a line driver or output buffer with optional drive strength and slew rate programmability. I/O cell 200 also includes an input circuit portion 206 that accepts input from the external circuit via I/O pad 120b, and feeds the core logic input signal I via I/O signal path 117. Input circuit portion 206, in one embodiment, includes a front-end amplifier with optional additional amplification and signal conditioning stages, e.g., Schmitt triggering and input filtering. I/O cell 200 also includes bypass line 208, which can be selectively enabled or disabled via bypass enable electronic switch 210.

I/O cell 200 includes circuitry for both input and output functionality, and can be programmed or otherwise configured to enable one function or the other. For example, output circuit portion 202 and input circuit portion 206 can each be individually enabled such that the output can be either enabled to drive the external circuit, or disabled in a high-impedance state; and the input can either be enabled to respond to the external circuit, or set to a fixed output (e.g., a logic high state). In another type of embodiment, the I/O cells of 118a and 118b are each either a dedicated input or a dedicated output circuit.

Figure 3A:
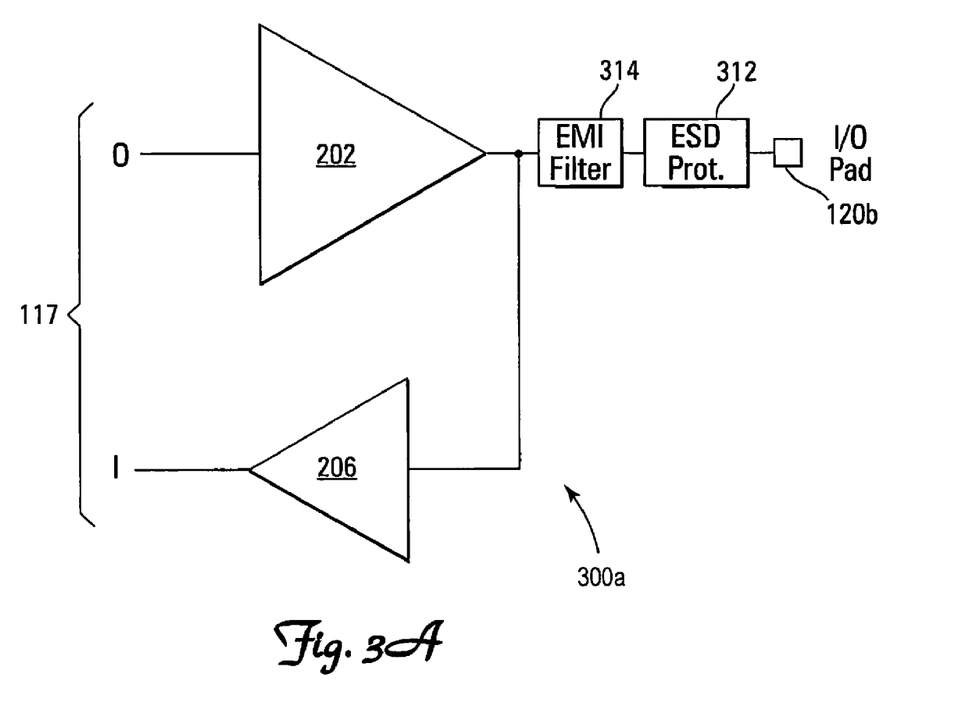
FIGS. 3A-3C are various embodiments of I/O cells that may be present in the exemplary IC of FIG. 1 having a relatively higher level of EMC performance according to aspects of the present invention.

Referring now to FIG. 3A, one example embodiment of I/O cell 300a having increased EMC performance is depicted. I/O cell 300a is similar to I/O cell 200 in terms of including output and input circuit portions 202 and 206, respectively, in a similar topology. I/O cell 300a differs from I/O cell 200 in that I/O cell 300a is missing bypass line 208. Additionally I/O cell 300a further includes either ESD protection components 312, or EMI filtering components 314, or both. ESD protection components 312 and EMI filtering components 314 can each include any suitable electrical or electronic arrangement known in the art, whether utilizing passive or active components, to facilitate the corresponding EMC-related performance of attenuating or decoupling incoming ESD transients or EMI from output and input circuit portions 202 and 206. EMI filtering components 314 can also function to suppress EMI emissions originating in IC 100.

Figure 3B:
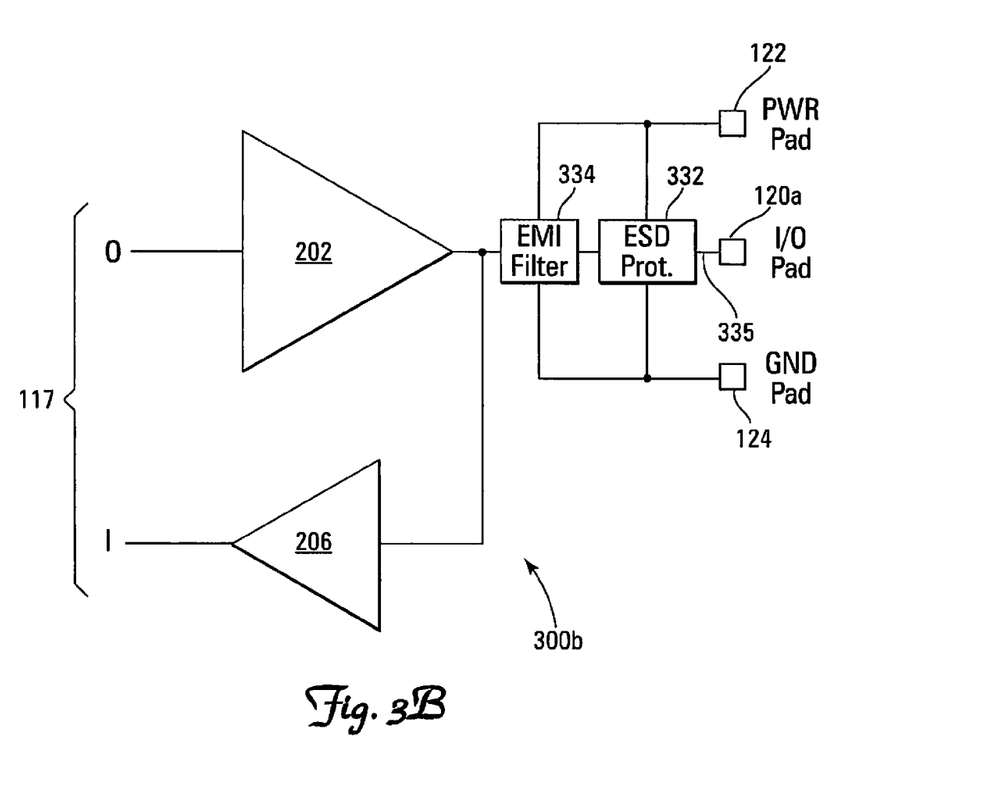

Referring again to FIG. 1, in a related embodiment, I/O cell 118a having increased EMC performance may optionally be associated with dedicated bonding pads 122 and 124 for wiring to power and ground pins 110 and 112, respectively. FIG. 3B illustrates an exemplary I/O cell 300b, which is one such embodiment of I/O cell 118a, utilizing dedicated power and ground bonding pads 122 and 124. I/O cell 300b includes ESD protective circuitry 332 and EMI filtering circuitry 334, each of which includes some form of coupling to either power or ground, or to both. For instance, ESD protective circuitry 332 can include clamping diodes from I/O node 335 to power bonding pad 122 or to ground bonding pad 124. Similarly, EMI filtering circuitry 334 can include capacitive coupling from I/O node 335 to power bonding pad 122 or to ground bonding pad 124. In this type of arrangement, the ESD transient or EMI entering the IC can be diverted to avoid, as much as possible, being conducted on IC die 102, thereby minimizing damage or interference to the more sensitive circuitry on die 102.

Figure 3C:
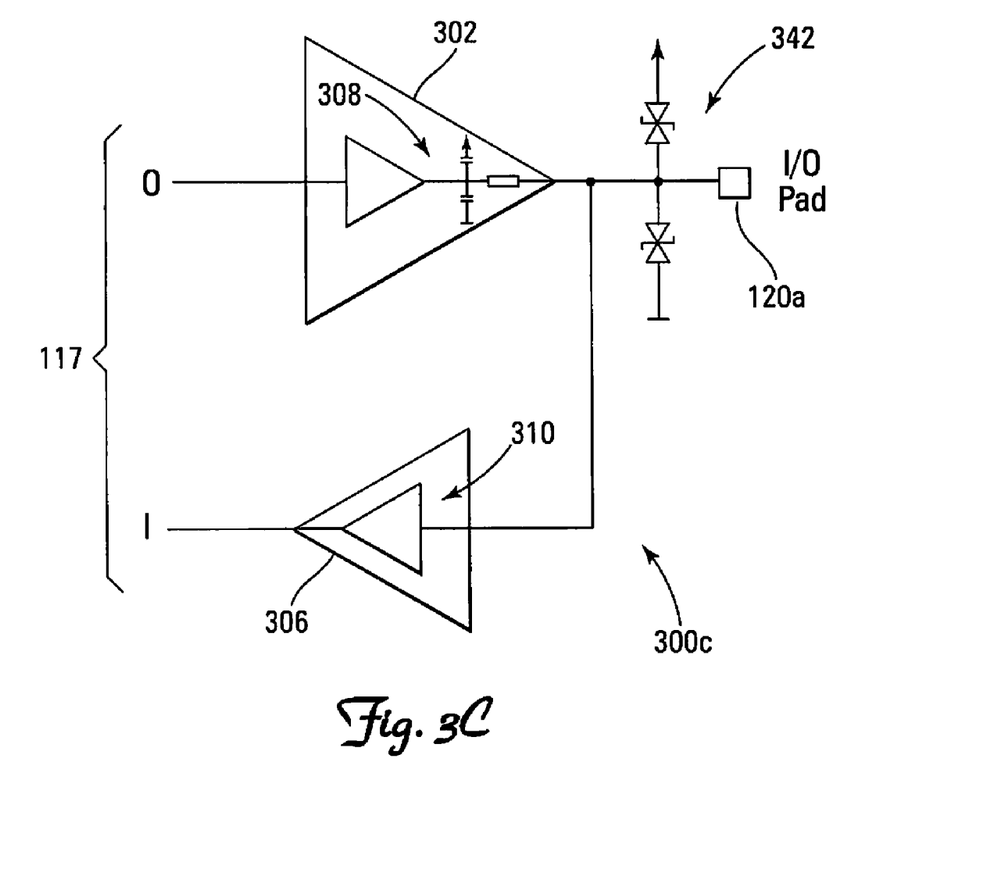

Referring to FIG. 3C, another example of I/O cell 118a having increased EMC performance is depicted. I/O cell 300c includes an output circuit portion 302 and an input circuit portion 306. Output circuit portion 302 and input circuit portion 306 are each designed for increased EMC performance.

In one embodiment, output circuit portion 302 has an output driver 308 that is particularly configured to prevent EMI emissions. For instance output driver 308 can include slew rate limiting circuitry, or other waveshaping or filtering attributes to reduce harmonic continent of the output signal. In one embodiment of input circuit portion 306, an input buffer 310 is designed and laid out for increased immunity from external EMI and transients. For instance, input buffer 310 may be designed for increased noise margin with a relatively greater hysteresis characteristic than in a corresponding circuit portion of unprotected I/O cell 118b.

In another embodiment of I/O cell 300c, output driver 308 or input buffer 310 are each formed from larger, more robust electronic devices capable of withstanding high voltages and currents, or devices situated in an isolated area of die 102 according to any of a variety of known techniques to protect the circuitry from incoming transients. U.S. Pat. No. 7,250,660, the disclosure of which is incorporated herein by reference, describes some of those techniques for protecting circuitry from ESD events. In a related embodiment, I/O cell 300c includes transient suppression circuitry 342 that is shared by both, the input and the output circuit portions 306 and 302.

Referring again to FIG. 1, I/O cells 118a and 118b are both associated with I/O signal path 117. It should be understood that die 102 of IC 100 can have additional I/O signal paths analogous to I/O signal path 117. In one such embodiment, certain ones of the additional I/O signal paths are interfaced with more than one I/O cell, and a corresponding more than one I/O bonding pad, as in the arrangement of signal path 117, I/O cells 118a and 118b, and bonding pads 120a and 120b. In one particular embodiment, each I/O signal path on die 102 that is interfaced with an I/O pin of package 103 is associated with a plurality of I/O cells.

In a related embodiment, IC 100 facilitates different types of I/O signals (e.g., analog/digital, high/low bandwidth, high/low voltage, etc.) and has correspondingly different types of I/O cells respectively associated with the different I/O signal paths and signal types. In this type of device, each type of I/O signal path can have a plurality of I/O cells of a type corresponding to the signal type. In another related embodiment, a single I/O path can be associated with a plurality of I/O cells of different types.

In operation, only one of I/O cells 118a and 118b is used. According to one aspect of the invention, either bonding pad 120a or 120b, but not both, are wired to I/O pin 116 in a fully-fabricated IC 100. In one embodiment, the I/O cell that is to be non-operational is rendered non-operational in the wire bonding process of the manufacture of IC 100. For instance, the bonding pad associated with the I/O cell that is to be non-operational is simply not wired to the corresponding I/O pin. Accordingly, in that embodiment, IC die 102 is the same for any I/O cell configuration. Thus, the manufacturer of IC 100 can stock die 102 for any variety of I/O configurations without having to manage production and stock of different variants at the die level. Additionally, because a wire bonding process is performed for producing IC 100 regardless of the I/O configuration, no additional programming or special configuration step is needed to selectively configure the I/O cells for IC 100; instead, only a corresponding wire bonding process is preferentially selected from among a group of wire bonding processes, each creating to a certain I/O cell configuration.

In a related aspect of the invention, the unused I/O cell is disconnected from core logic 104. In the embodiment depicted in FIG. 1, I/O signal path 117 is connected to the appropriate I/O cell by a multiplexer circuit (MUX) 126. MUX 126 includes control input 127 connected to bonding pad 128 that controls the connection by MUX 126 to output path, path 130a to I/O cell 118a, or path 130b to I/O cell 118b. To control MUX 126, bonding pad 128 is connected to either power or ground, such as, for example, either to power pin 110, or to ground pin 112.

In a related embodiment, the wire bonding process for IC 100 includes different versions, or recipes, each corresponding to certain EMC requirements for the various I/O signal paths of IC 100. Each wire bonding process recipe defines which I/O cells are to be preferentially wired to the IC package pins, and which control pins of multiplexers that direct the I/O signal paths are to be asserted by hardwiring.

In another embodiment, power to the unused I/O cell is disconnected to avoid the unnecessary power consumption associated with leaving the unused I/O cells in a quiescent state. For example, each I/O cell may include a dedicated bonding pad for either power or ground, or both. According to this embodiment, the wire bonding process recipe corresponding to the desired I/O cell configuration facilitates either by powering, or leaving un-powered, the non-selected I/O cells. In a related embodiment, a single bonding pad may be used for wiring supply power to a group of I/O cells that are to be commonly either enabled or disabled.

Figure 4:
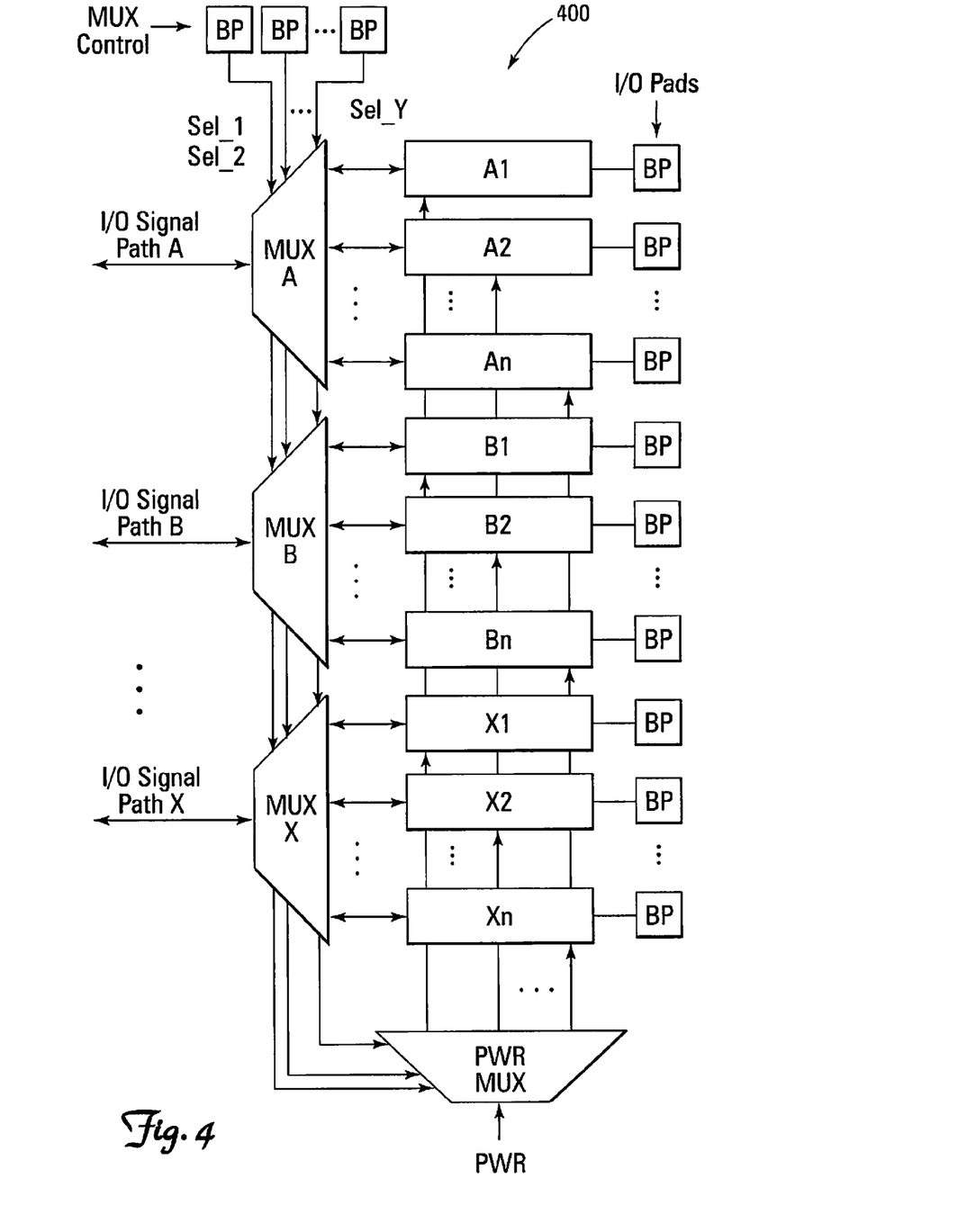
FIG. 4 is a schematic diagram of a multiplexer arrangement that facilitates enabling preferential selection of certain groups of I/O cells using hard wiring techniques according to aspects of the present invention.

FIG. 4 is a schematic diagram illustrating an exemplary multiplexer arrangement 400 for selectively enabling or disabling groups of I/O cells for a X-bit-wide bus. In arrangement 400, separate I/O signal paths A through X can be assigned a desired EMC performance characteristic from among n available EMC performance characteristics. For each signal path A through X, a corresponding one of MUX A through X connects the signal path to a single I/O cell, selected from among corresponding I/O cells 1 through n, having the desired EMC performance characteristics. In one embodiment, I/O cells A1, B1, ..., X1 all have the same EMC performance characteristic, all I/O cells A2, B2, ..., X2 have the same EMC performance characteristics, and so forth.

Each I/O cell A1 through Xn is connected to a dedicated I/O signal bonding pad BP that facilitates the signal connection by wiring to the appropriate package pin. Each MUX A, B, . . . , X has at least one select input Sel1, Sel2, . . . , Sel_Y. The number Y of select inputs can depend on the number n of available selections to be made by the multiplexers, e.g., Y=ceiling(LOG$_2$ (n)). Each select input has a dedicated MUX Control bonding pad as illustrated. Also, as depicted, MUXs A, B, . . . , X share the select inputs such that every I/O selecting MUX connects to an I/O cell having a common number 1-n.

In one embodiment, as depicted in FIG. 4, the power supply or ground connection (generally referred to herein as PWR) for each I/O cell is switched via a PWR MUX. PWR MUX shares control inputs Sel1, Sel2, . . . , Sel_Y, such that power is supplied only to the selected I/O cells. In this arrangement, PWR for groups of I/O cells that are commonly enabled or disabled is thus be switched using a single multiplexer corresponding to that group of I/O cells, and avoiding having to allocate space for additional bonding pads supplying power to the groups of I/O cells.

Figure 5:
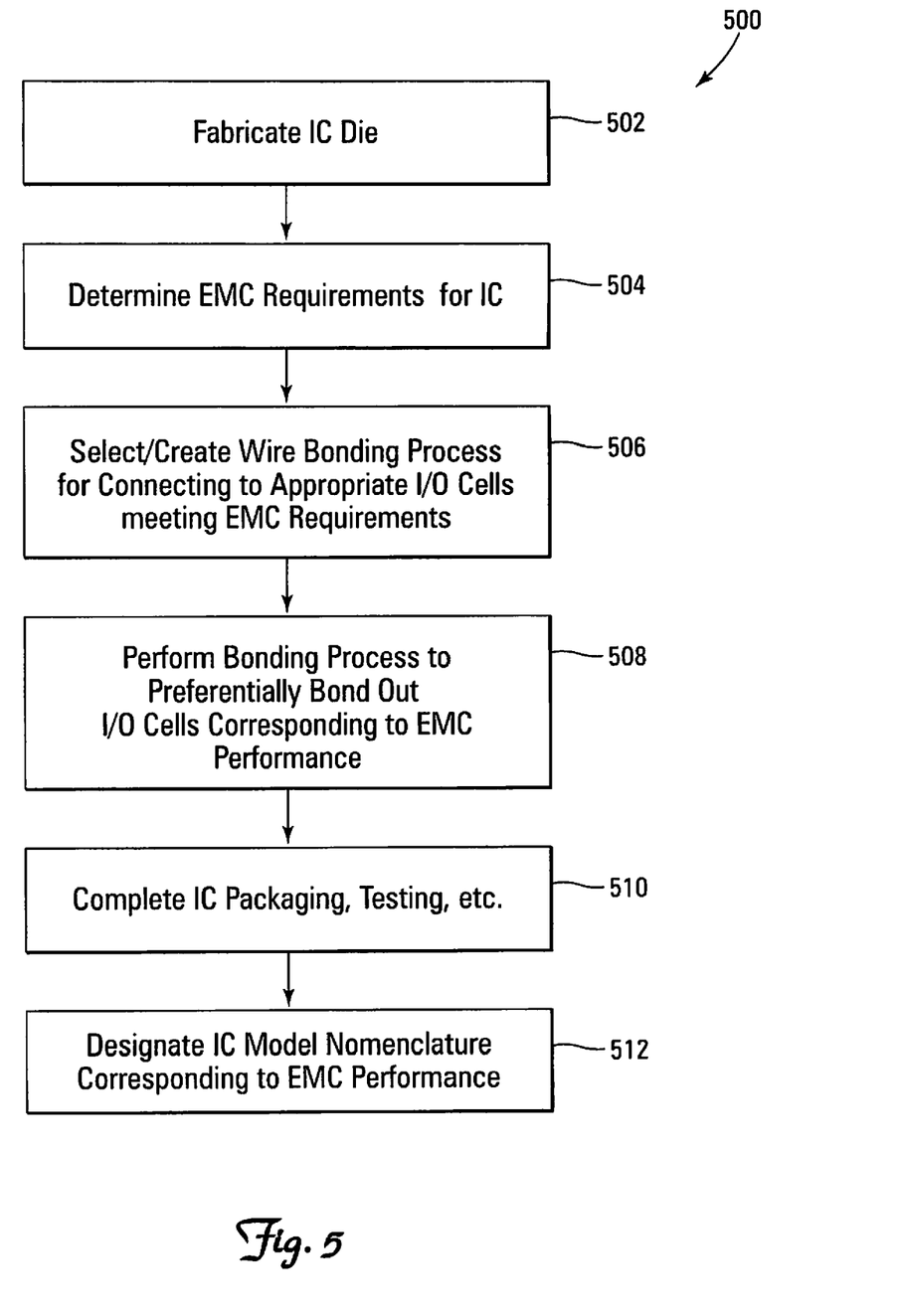
FIG. 5 is a flow diagram illustrating a process for manufacturing an IC according to aspects of the invention.

Referring now to FIG. 5, one embodiment of a process of manufacturing an IC to selectively designate EMC performance of I/O circuits is illustrated. At 502, the IC die, such as IC die 102, is fabricated that supports selection of multiple different I/O cells for a common I/O signal path, but that is otherwise not configured for any one EMC performance characteristic. The I/O cells of the IC having different EMC performance characteristics are each connected to a dedicated bonding pad as described above with reference to FIGS. 1-4.

At 504, the EMC performance requirements for the IC to be manufactured are determined. The determination may be based on customer demands, or on a defined product offering. The IC to be manufactured may thus be designated as regular EMC performance (i.e., functional performance or features inconsistent with increased EMC performance), or increased EMC performance.

At 506, a wire bonding process is created or selected, including identifying the I/O or groups of I/O cells to be selectively wired and enabled. The wire bonding process created or selected also includes creating or retrieving the automation instructions for programming wire bonding equipment. The wire bonding process may involve creating or selecting specific tooling corresponding to the determined I/O cell configuration. The wire bonding process may also involve selection of wires of differing characteristics, such as current density capabilities for different EMC needs. Furthermore, the selected or enabled wire bonding process can include, where appropriate, additional wire connections for controlling multiplexers to select the required I/O paths, and for powering and otherwise enabling the operation and EMC suppression functionality of the selected I/O cells.

In a related embodiment, where selection between I/Os for a number of different I/O pads is concerned, the I/O pads may be placed in a multiple row configuration. According to this embodiment, wire bonding each pin to a first row of pads utilizes I/O cells of a first EMC performance characteristic, while wire bonding each pin to a second row of pads utilizes I/O cells of a second EMC performance characteristic.

At 508, the wire bonding process is performed to preferentially bond out the I/O cells corresponding to the designated EMC performance. Performing the wire bonding process includes connecting the I/O bonding pads to the package pins, as well as hardwiring the MUX control inputs, where appropriate. Also, where appropriate, any dedicated power and ground bonding pads corresponding to I/O cells are connected to the package pinout. One such approach for connecting power is shown in Published U.S. Patent Application No. 2007/0170451, the disclosure of which is incorporated by reference herein. In accordance with certain aspects of the present invention, I/O cells having increased EMC performance, such as those described in connection with FIG. 3B, are connected to the package pinout. Following the wire bonding, the EMC performance of the IC is physically configured.

At 510, the IC packaging is completed, including such actions as conducting all production quality testing, performance testing, and completing assembly of the IC package to encapsulate the IC die. At 512, the model or version number of the IC is designated and optionally marked on the product to indicate a model nomenclature corresponding to the configured EMC performance of the IC.

The embodiments above are intended to be illustrative and not limiting. Additional embodiments are within the claims. In addition, although aspects of the present invention have been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method for manufacturing an integrated circuit (IC) to selectively designate electromagnetic compatibility (EMC) performance of the IC, the method comprising:
    determining an EMC performance level required for the IC from among a first EMC performance level and a second EMC performance level that is different from the first EMC performance level;
    packaging, into an IC package having a plurality of pins, a die of the IC that has a plurality of different types of input or output (I/O) cells for a common I/O signal path, the packaging including preferentially wiring a pin of the plurality of pins that is associated with the common I/O signal path to either a first type or a second type of I/O cell for the common I/O signal path such that:
        to designate the first EMC performance level, the first type of I/O cell of the plurality of different types of I/O cells is wired to the pin; and
        to designate the second EMC performance level, the second type of I/O cell of the plurality of different types of I/O cells is wired to the pin.

2. The method of claim 1, wherein the EMC performance that is selectively designated includes at least one type EMC performance selected from the group consisting of: electrical transient immunity, radio frequency interference (RFI) immunity, radio frequency emissions suppression, or any combination thereof; and
    wherein preferentially wiring the pin to the first type of I/O cell provides improved EMC performance for the at least one type of EMC performance.

3. The method of claim 1, wherein the wiring of the pin to either the first or the second type of I/O cell includes performing a wire bonding operation.

4. The method of claim 1, wherein the die of the IC includes a multiplexing circuit that enables either the first type or the second type of I/O cell based on a state of a control input of the multiplexing circuit, and wherein the packaging further comprises:
- configuring the multiplexing circuit to enable either the first type or the second type of I/O cell by preferentially wiring the control input to either a first node or a second node of the packaged IC.

5. An integrated circuit (IC) produced by a process for manufacturing an IC to selectively designate electromagnetic compatibility (EMC) performance of the IC, the process comprising:
- packaging, into an IC package having a plurality of pins, a die of the IC that has a plurality of different types of input or output (I/O) cells for a common I/O node, the packaging including preferentially wiring a pin of the plurality of pins that is associated with the I/O node to either a first type or a second type of I/O cell for the common I/O node such that:
- to designate a first type of EMC performance, the first type of I/O cell of the plurality of different types of I/O cells is wired to the pin; and
- to designate a second type of EMC performance, the second type of I/O cell of the plurality of different types of I/O cells is wired to the pin.

6. The IC of claim 5, wherein the EMC performance that is selectively designated includes at least one type EMC performance selected from the group consisting of: electrical transient immunity, radio frequency interference (RFI) immunity, radio frequency emissions suppression, or any combination thereof.

7. The IC of claim 5, wherein the wiring of the pin to either the first or the second type of I/O cell is performed by a wire bonding operation.

8. The IC of claim 5, wherein the first type of I/O cell comprises at least one suppression circuit selected from the group consisting of: of a transient suppression circuit, an electromagnetic interference (EMI) suppression circuit, or any combination thereof.

9. The IC of claim 8, wherein the at least one suppression circuit includes at least one of a ground node and a power supply node, and wherein the at least one of the ground node and the power supply node includes at least one respective bonding pad dedicated to the first type of I/O cell, wherein the first type of EMC performance is designated, the at least one respective bonding pad is wired to a corresponding power supply or ground pin of the plurality of pins.

10. The IC of claim 5, wherein the die of the IC includes a multiplexing circuit that enables either the first type or the second type of I/O cell based on a state of a control input of the multiplexing circuit, and wherein the packaging further comprises:
- configuring the multiplexing circuit to enable either the first type or the second type of I/O cell by preferentially wiring the control input to either a first node or a second node of the packaged IC.

* * * * *